United States Patent [19]
Harris

[11] Patent Number: 5,481,125
[45] Date of Patent: Jan. 2, 1996

[54] COMPACT CMOS ANALOG CROSSPOINT SWITCH MATRIX

[75] Inventor: Colin Harris, New Westminster, Canada

[73] Assignee: Mitel Corporation, Kanata, Canada

[21] Appl. No.: 85,458

[22] Filed: Jun. 29, 1993

Related U.S. Application Data

[63] Continuation of Ser. No. 756,064, Sep. 6, 1991, abandoned, which is a continuation of Ser. No. 352,543, May 16, 1989, abandoned.

[30] Foreign Application Priority Data

Jun. 21, 1988 [CA] Canada ................................. 570038

[51] Int. Cl.⁶ .................................................. H01L 27/10
[52] U.S. Cl. ........................ 257/203; 257/202; 257/208
[58] Field of Search ............................. 357/45; 257/202, 257/203, 208

[56] References Cited

U.S. PATENT DOCUMENTS

| | | | |
|---|---|---|---|
| 4,516,312 | 5/1985 | Tomita | 357/45 |
| 4,651,190 | 3/1987 | Suzuki et al. | 357/45 |
| 4,682,202 | 7/1987 | Tanizawa | 357/45 |
| 4,745,084 | 5/1988 | Rowson et al. | 357/45 |
| 4,764,798 | 8/1988 | Kawabata | 357/45 |
| 4,783,692 | 11/1988 | Uratani | 357/45 |
| 4,851,892 | 7/1989 | Anderson et al. | 357/45 |
| 4,853,757 | 8/1989 | Kuramitsu et al. | 357/45 |
| 4,857,981 | 8/1989 | Matsumoto et al. | 357/45 |
| 4,884,118 | 11/1989 | Hui et al. | 357/45 |
| 4,962,413 | 10/1990 | Yamazaki et al. | 357/45 |

Primary Examiner—Ngân V. Ngô
Attorney, Agent, or Firm—Levine & Mandelbaum

[57] ABSTRACT

An integrated circuit analog crosspoint switch FET array which utilizes considerably reduced silicon substrate area than previously. In a preferred embodiment, pairs of the separate diffused regions of different FETs which are connected to the same input are common, forming separate single diffused regions. The separate single diffused regions and the central single diffused regions alternate continuously in a row, separated by the channel regions forming the various transistors. The result is a continuous row of transistors having common diffused regions, except for the transistors at the end of the row, which have their outer diffused regions not in common with any other.

2 Claims, 2 Drawing Sheets

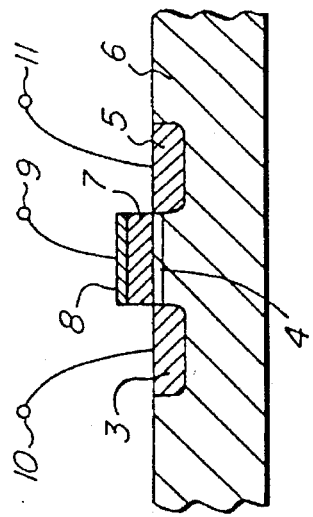
FIG. 1
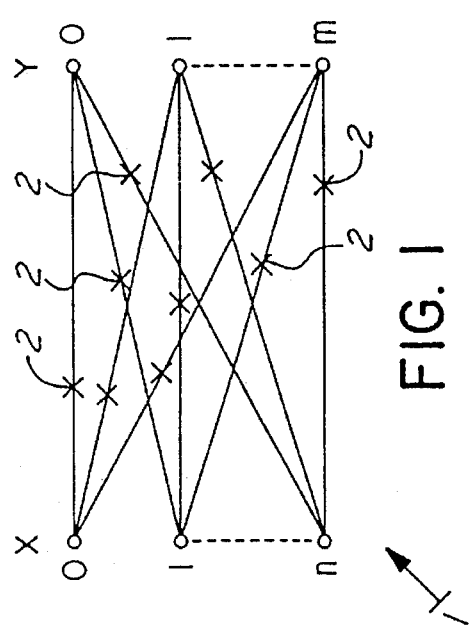
FIG. 2 PRIOR ART
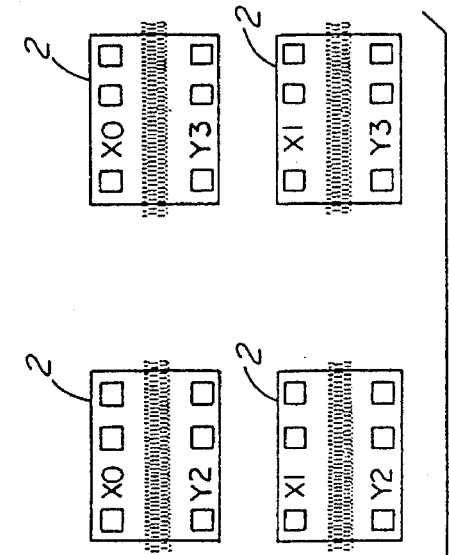
FIG. 3 PRIOR ART
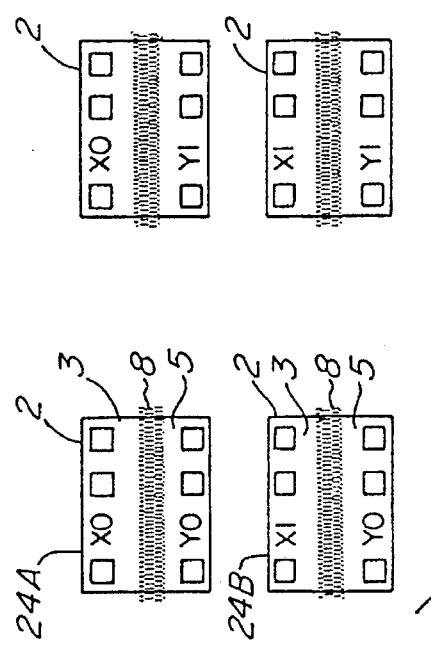

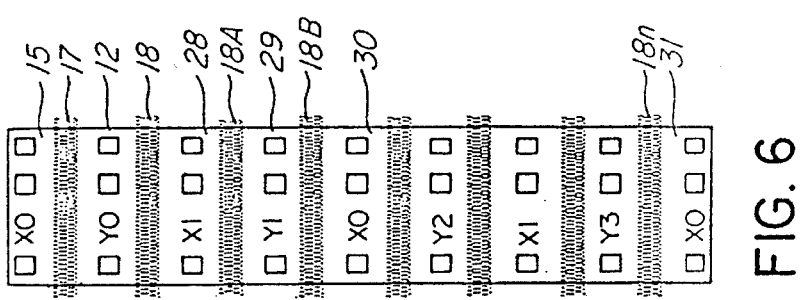
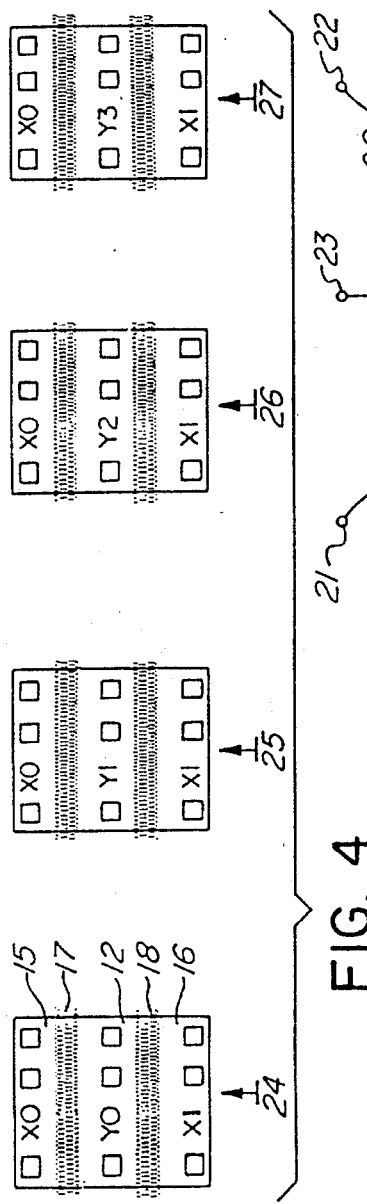
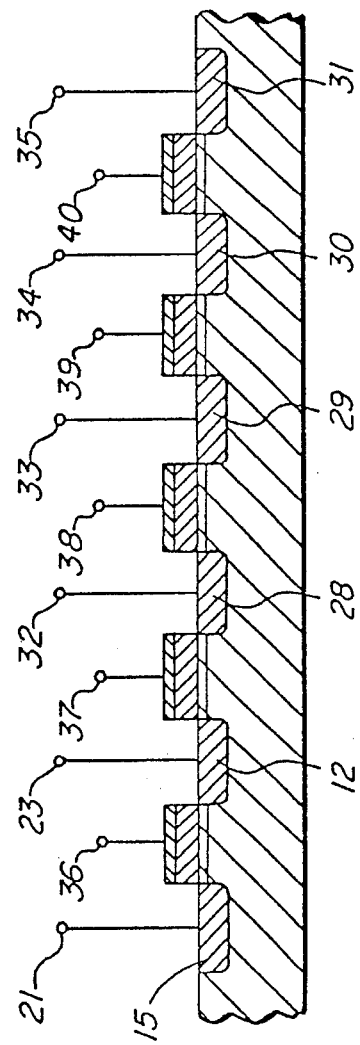
FIG. 4
FIG. 5
FIG. 6
FIG. 7

COMPACT CMOS ANALOG CROSSPOINT SWITCH MATRIX

This application is a continuation of application Ser. No. 07/756,064 filed on Sep. 6, 1991, which is a continuation of Ser. No. 07/352,543 filed May 16, 1989, both are now abandoned.

This invention relates to switching devices and in particular to an MOS FET switch array which consumes considerably reduced silicon substrate area than prior art devices.

Analog crosspoint switches which connect an array of inputs to an array of outputs are typically fabricated as separate MOS FET transistors in a silicon substrate. Each separate transistor is isolated from the others, and to connect n inputs to m outputs of the array, a total of n×m transistors are necessary to be used to form the switching array. In order to reduce resistance through the array when the transistors are on, the transistors are generally produced having large features. The result is that considerable area of an integrated circuit is used in the formation of the array, which is costly and reduces the product yield.

The present invention is a structure for producing an array, described in two embodiments, which considerably reduces the area of silicon substrate surface used, to provide the same number of cross-points as in the prior art. Whereas using the separate switching transistor array structure, the number of impurity diffused regions is 2×n×m, in one embodiment this is reduced to 3/2×n×m, and in the other embodiment the number of diffusions is reduced to (n×m)/2+1. Since each impurity diffused region involves the use of a certain area of the silicon substrate, it may be seen that in the latter embodiment the substrate surface area required for the diffused regions is reduced to approximately ¼ or less than for the prior art single transistor structure. Considerably reduced cost and increased yield clearly results.

The improvements are obtained in a semiconductor crosspoint apparatus having a plurality of inputs for connection to a plurality of outputs via field effect transistor (FET) switches, each FET being comprised of a pair of impurity diffused regions in a silicon substrate each usable as a source or as a drain and being separated by a channel region having an insulated gate thereover. A pair of diffused regions for a pair of FETs are common and form a central single diffused region, separated by channel regions for the respective FETs on both sides of the single diffused region from separate diffused regions of the pair of FETs. The single diffused region can be connected to one output and the separate diffused regions can be connected to corresponding separate inputs to allow switching connections of either or both of the separate inputs to the one output by application of a switching signal to one or both of the insulated gates.

According to another embodiment successive ones of a group of single diffused regions are connected to different outputs and one of each of the separate diffused regions of FETs of the group are connected together to one input and the other of the separate diffused regions of the group are connected together to another input, whereby said one and another inputs can be separately switched by the FETs to ones of the different outputs.

According to a preferred embodiment, pairs of the separate diffused regions of different FETs which are connected to the same input are common, forming separate single diffused regions. Preferably the separate single diffused regions and the central single diffused regions alternate continuously in a row, separated by the channel regions forming the various transistors. The result is a continuous row of transistors having common diffused regions, except for the transistors at the end of the row, which have their outer diffused regions not in common with any other.

It should be understood that the inputs and outputs can be reversed, and reference in this specification to an input should alternatively be construed as reference to an output, and vice versa.

A better understanding of the invention will be obtained by reference to the detailed description below, in conjunction with the following drawings, in which:

FIG. 1 illustrates a cross-point switch array,

FIG. 2 is a plan view of a typical layout of transistors in a silicon substrate without its metallization layer according to the prior art, FIG. 3 is a cross-section of a single FET switch according to the prior art of the kind used in FIG. 1, FIG. 4, is a plan view of a group of transistor structures forming an array in accordance with a first embodiment of the invention, FIG. 5 is a cross-section of one of the transistor structures shown in FIG. 4, FIG. 6, is a plan view of the preferred form of the invention, and FIG. 7 is a cross-sectional view of part of the array of FIG. 6.

Turning now to FIG. 1, a schematic view of a cross-point switch array is shown. Each of the inputs in the column X, that is, X0, X1 . . . Xn is to be connected to each of the outputs of the column Y, being Y0, Y1 . . . Ym. The connections are provided by means of switches 2. The switches are typically fabricated as individual MOS FET transistors (herein referred to as FETs).

FIG. 2 illustrates an array of switching transistors 2. Reference is also made to FIG. 3 illustrating a cross-section of one of the transistors. The transistor is shown without its usual conductor metallization layer to make the invention clearer.

Each FET is formed of an impurity diffused region 3 forming a source or drain separated by a channel region 4 from another impurity diffused region 5 forming a drain or source. The sources, drains and channels are contained within a silicon substrate 6 in a well known manner.

Above the channel region is an insulating layer 7, typically formed of silicon dioxide. A conductive gate layer 8, typically formed of polycrystalline silicon overlies the insulation layer 7.

As is well known in the art, application of an appropriate voltage at a gate terminal 9 allows signals applied to the source or drain region 3 from an input terminal 10 to pass via the channel region 4 to output terminal 11.

Individual switching transistors of the type described above are connected between each input X0–Xn and each output X0–Xm, forming the switching array or matrix.

In accordance with a first embodiment of this invention as shown in FIGS. 4 and 5, a pair of impurity diffused source or drain regions of a pair of FETs connected between a pair of inputs, e.g. X0 and X1 and a single output, e.g. Y0 are common, forming a central single diffused region 12. The central single diffused region 12 is separated by channel regions 13 and 14 for the respective FETs on both sides of the single diffused region from separate diffused regions 15 and 16 of the pair of FETs. Thus common impurity diffused region 12 forms a source or drain and regions 15 and 16 form drains or sources for two transistors with common region 12. Gates 17 and 18 are insulated via insulating dielectrics 19 and 20 respectively from channel regions 13 and 14. For the device shown in FIG. 5, two inputs 21 and 22 are connected by the two FETs thus formed to output terminal 23.

It may be seen that the two transistors 24A and 24B in FIG. 2 having input regions marked X0 and X1 and outputs marked Y0 have a final metallization layer deposited thereover in order to form the switching matrix, and as a result the two outputs Y0 are connected together. In the present invention (FIG. 4) a similar function is achieved by merging (making common) the diffused regions of the two transistors, to provide a single output which in this example would be connected to output Y0.

Four such double transistors each forming two crosspoints are shown in FIG. 4, as representative examples. It may be seen that as marked the two inputs of each multiple transistor are connected to the inputs X0 and X1, while the outputs are connected to different output terminals Y0, Y1, Y2, Y3, etc. In the example shown in FIG. 4, a 2 X 4 matrix is formed, but it will be obvious to a person skilled in the art that larger arrays can be set up in similar fashion. Clearly, also inputs and outputs are interchangeable.

In this construction, it may be seen that there is a saving of space on the silicon chip which would be required to form a diffused region for one of each of the transistors, as well as the area required for isolation regions around each of those transistors. Rather than requiring 2×n×m source and drain diffusions, as with the embodiment shown in FIGS. 4 and 5, only (n×m) ×3/2 diffused regions are required to provide the same number of crosspoints as in the prior art.

FIGS. 6 and 7 show a layout and a cross-section of a silicon chip according to a preferred embodiment of the invention. In this case pairs of the separate diffused regions of the different FETs shown in FIG. 4 which are connected to the same input are common, forming separate single diffused regions. It is thus preferred that the separate single diffused regions and the central single diffused regions alternate continuously in a row separated by the channel regions, as shown in FIG. 6.

To understand the structure of the device of FIG. 6, it would be illustrative to consider first FIG. 4. If one connects each of the transistors of FIG. 4 in series, by placing the bottom two diffused regions of transistors 24 and 25 which are connected as marked to input X1 together in common, and place the top two diffused regions of transistors 25 and 26 both of which are connected to input X0 in common, and place the bottom two diffused regions connected to input X1 of transistors 26 and 27 together in common, the structure resulting in FIG. 6 is obtained. The designations X0–Xn indicate the connections of the diffused regions to the various correspondingly labelled inputs and the designations Y0–Yn indicate their connections to the correspondingly labelled outputs. At one end is a not-common source or drain single diffused region 15 for connection to input X0, then the common diffused region 12 for two transistors as described above for connection to output Y0, then a common diffused region 28 which would form the other of the drain and source of transistors 24 and 25, if separated, for connection to input X1, then a common diffused region 29 corresponding to common diffused region 12, but in transistor 25, for connection to output Y1, then the common diffused region 30 of the regions which would be transistors 25 and 26 in FIG. 4 which would be connected to input X0, etc., each separated by channel regions and gates 18, 18A . . . 18n. At the end of the array is a single not-common source or drain diffused region 31 of the end transistor.

A cross-section of the above is shown in FIG. 7 which is directly analogous to FIG. 5, but a sequence of separate single diffused regions and central single diffused regions alternate in a row, separated by the channel regions.

The embodiment of FIG. 7 has a further reduced number of diffused regions from the embodiment of FIGS. 4 and 5, being (n×m)/2+1.

As may be seen in FIG. 7, diffused region 15 is connected to input terminal 21 which can be connected to input X0, diffused region 12 is connected to output terminal 23 which can be connected to output Y0, diffused region 28 can be connected to input X1 via input terminal 32, diffused region 29 can be connected to output Y1 via output terminal 33, diffused region 30 can be connected to input X0 via input terminal 34, etc.

In the above-described manner large cross-point switch arrays can be formed. With this embodiment the amount of silicon surface area required for the diffused regions is approximately 1/4 or less than that required in the prior art structure shown in FIG. 2. Significant economy and increase in product yield results, without increasing the resistance per cross-point, for devices with similar feature sizes as in the prior art.

A person understanding this invention may now conceive of alternative embodiments or variations thereof using the principles described herein. All are considered to be within the sphere and scope of the invention as defined in the claims appended hereto.

I claim:

1. A semiconductor crosspoint switch for switching each of a plurality of first terminals of a matrix of terminals to a plurality of second terminals of said matrix of terminals, comprising an integrated circuit comprised of a series of more than two field effect transistors (FETs) of similar conductivity type each formed of a pair of impurity diffused regions separated by a channel region underlying an insulated gate, pairs of FETs sharing adjacent diffused regions, the number of diffused regions being equal to twice a larger number of the first and second terminals plus one, each terminal of said larger number of the first and second terminals being respectively connected in sequence to a corresponding even numbered diffused region, each terminal of a pair of the smaller number of the first and second terminals being connected to alternate odd numbered diffused regions respectively, and means for applying a switching signal to a gate of a transistor to which a first and a second terminal are connected whereby an FET having said gate can conduct, thereby connecting the first terminal and the second terminal connected to said FET together.

2. A semiconductor crosspoint switch as defined in claim 1 in which the first terminals are input terminals and the second terminals are output terminals.

* * * * *